Figure 1:
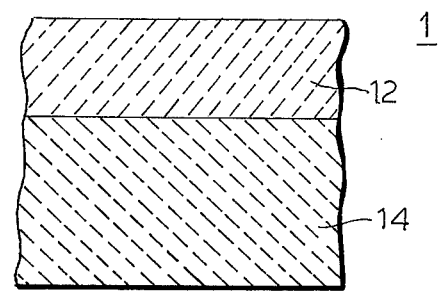

United States Patent [19]

Ono et al.

[11] 4,037,176
[45] July 19, 1977

[54] MULTI-LAYERED SUBSTRATE FOR A SURFACE-ACOUSTIC-WAVE DEVICE

[75] Inventors: Shusuke Ono, Takatsuki; Kiyotaka Wasa, Nara; Shigeru Hayakawa, Hirakata, all of Japan

[73] Assignee: Matsushita Electric Industrial Co., Ltd., Japan

[21] Appl. No.: 667,374

[22] Filed: Mar. 16, 1976

[30] Foreign Application Priority Data

Mar. 18, 1975 Japan .................................. 50-33417
Mar. 18, 1975 Japan .................................. 50-33419
June 18, 1975 Japan .................................. 50-74873

[51] Int. Cl.² ........................ H03H 9/30; H03H 9/02; H01L 27/20; H03H 9/26
[52] U.S. Cl. .................................... 333/30 R; 310/8; 310/8.9; 310/9.8; 333/72; 427/100
[58] Field of Search ................... 333/30 R, 72; 310/8, 310/8.1, 8.2, 8.3, 9.5, 9.7, 9.8, 8.9; 331/107 A, 154, 155, 175, 187; 427/100

[56] References Cited
U.S. PATENT DOCUMENTS

| 3,786,373 | 1/1974 | Schulz et al. ................. 333/30 R |
| 3,931,420 | 1/1976 | Schulz et al. ................. 427/100 |
| 3,943,389 | 3/1976 | Hickernell et al. ............ 310/9.5 |
| 3,965,444 | 6/1976 | Willingham et al. ......... 333/30 R |

Primary Examiner—Eli Lieberman
Assistant Examiner—Marvin Nussbaum
Attorney, Agent, or Firm—Wenderoth, Lind & Ponack

[57] ABSTRACT

This invention provides a multi-layered substrate for a surface-acoustic-wave device which substrate comprises a piezoelectric layer on a base, the temperature coefficient of a phase velocity of the surface-acoustic-wave in the piezoelectric layer being different from that of the base, the piezoelectric layer having a thickness less than a wavelength of the SAW. This multi-layered substrate can have a large electromechanical coupling and controlled temperature coefficient of the phase velocity.

17 Claims, 24 Drawing Figures

MULTI-LAYERED SUBSTRATE FOR A SURFACE-ACOUSTIC-WAVE DEVICE

This invention relates to a multi-layered substrate for a surface-acoustic-wave (which will simply be referred to as SAW hereinafter) device.

Various kinds of substrates each including a piezoelectric material, for example, $LiNbO_3$, and quartz have been used for a surface-acoustic-wave device such as a delay line, a filter and a convolver. However, these substrates have defects. For example, $LiNbO_3$ has a large temperature coefficient of phase velocity, although it provides a large electromechanical coupling. In the case of quartz, it has a very small electromechanical coupling, although it provides a small temperature coefficient of phase velocity.

Accordingly, it is a principal object of this invention to provide an improved substrate for SAW devices which overcomes the above-noted defect of the prior art and has a large electromechanical coupling as well as a controlled temperature coefficient.

This object is achieved by using a multi-layered substrate which comprises a base and a piezoelectric layer on the base, in which the temperature coefficient of phase velocity in the piezoelectric layer is different from that of the base. An additional intermediate layer can be inserted between the piezoelectric layer and the base so as to further improve the properties of the multi-layered substrate.

Features of this invention will be described in detail hereinafter with the aid of drawings, in which:

FIGS. 1 to 24 are constructions, in cross-sections, and characteristics of multi-layered substrates in accordance with this invention.

Referring to FIG. 1, a multi-layered substrate 1 for a surface-acoustic-wave device in accordance with this invention comprises a piezoelectric layer 12 on a base 14, in which a temperature coefficient of a SAW phase velocity in said piezoelectric layer 12 is different from that in said base 14, said piezoelectric layer having a layer thickness less than a wave length of the SAW.

The temperature coefficient of a SAW phase velocity, (TC), is expressed by the following relation, $(TC)=(1/v)(\delta v/\delta T)$, where v is a phase velocity and T is a temperature. The piezoelectric layer 12 is made of a suitable material such as ZnO, CdS, $LiNbO_3$, $Bi_{12}GeO_{20}$ crystal and piezoelectric ceramic having a temperature coefficient $(TC)_2$. The base 14 is made of suitable material such as Si, Ge, sapphire and glass having a temperature coefficient $(TC)_4$. Said $(TC)_2$ is not equal to said $(TC)_4$.

Figure 2:
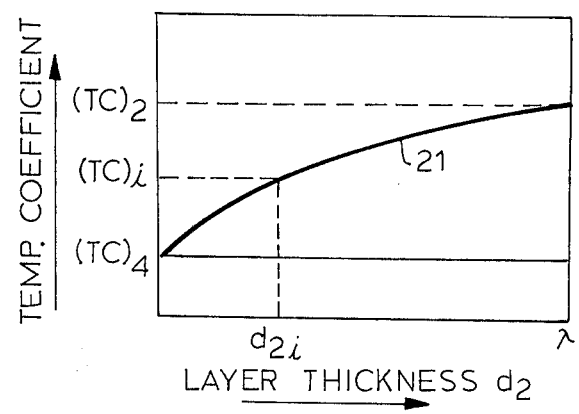

It has been discovered in accordance with this invention that the substrate of this type can exhibit a controllable temperature coefficient by choosing a suitable layer thickness. Referring to FIG. 2, a typical temperature coefficient (TC) of this substrate 1 is shown by curve 21 for a case of $(TC)_2 > (TC)_4$. When a layer thickness $d_2$ of the piezoelectric layer 12 is very small as compared with the wave length λ of the SAW, the temperature coefficient (TC) is nearly equal to the temperature coefficient $(TC)_4$ in the base 14. As $d_2$ increases up to said λ, said (TC) increases and becomes finally $(TC)_2$ of the piezoelectric layer 12. Accordingly, the multi-layered substrate with the temperature coefficient ranging from $(TC)_4$ to $(TC)_2$ is obtainable by using the layer thickness $d_2$ less than said λ. For example, the substrate with $(TC)_i$ can be obtained by only setting the thickness to be $d_{2i}$ as shown in FIG. 2.

From the above description, it is evident that the multi-layered substrate 1 comprising the piezoelectric layer 12 and the base 14 for $(TC)_2 < (TC)_4$ can also be used for making a SAW device with a controllable temperature coefficient ranging from $(TC)_2$ to $(TC)_4$.

It has also been discovered in accordance with this invention that the properties of the multi-layered substrate 1 can be improved when a sign of said temperature coefficient in said piezoelectric layer $(TC)_2$ is different from that in said base $(TC)_4$. Such a substrate can easily be a substrate with a very small or zero temperature coefficient.

Figure 3:
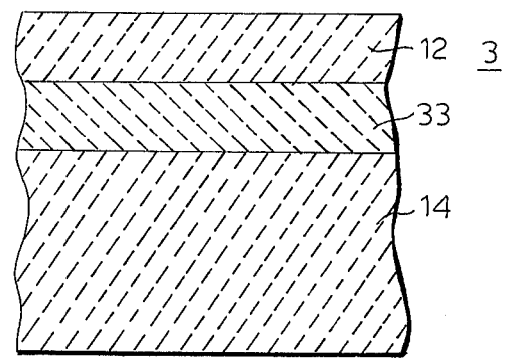

It has also been discovered in accordance with this invention that an additional intermediate layer can further improve the properties of the multi-layered substrate. Referring to FIG. 3, the further improved substrate 3 comprises an intermediate layer 33 inserted between the piezoelectric layer 12 and the base 14, in which said intermediate layer 33 has a temperature coefficient different from that each in said piezoelectric layer and said base.

Figure 4:
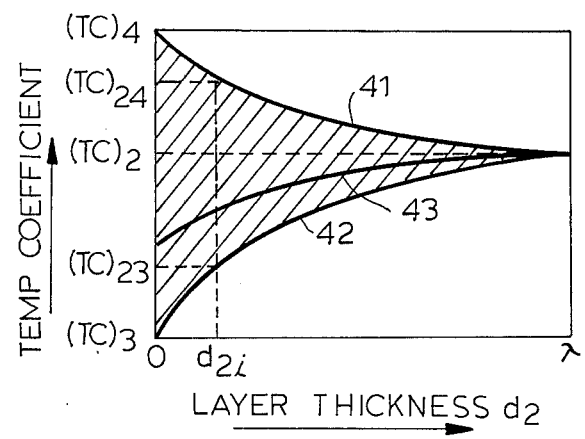
Figure 5:
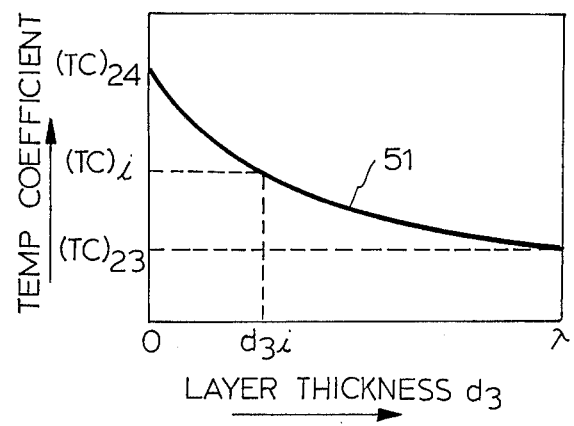

The intermediate layer 33 is made of a suitable material such as silicon oxide and glass having a temperature coefficient $(TC)_3$. Said $(TC)_3$ is not equal to said $(TC)_2$ nor to said $(TC)_4$. Referring to FIG. 4, said substrate 3 has a temperature coefficient in a hatched region surrounded by a curve 41, a curve 42 and a vertical axis for a case of $(TC)_4 > (TC)_2 > (TC)_3$. For said substrate 3 having a layer thickness $d_2$ less than said wave length λ, when a layer thickness $d_3$ is very small as compared with λ, the temperature coefficient (TC) is shown by curve 41. When $d_3$ is equal to or larger than λ, (TC) is shown by curve 42. When $d_3$ is less than λ, (TC) is shown by curve 43. As $d_3$ increases from a value nearly equal to zero to a value larger than λ for each value of $d_2$ less than λ, the temperature coefficient in the substrate 3 is initially given by curve 41, decreases and becomes finally a value shown by curve 42. When a layer thickness $d_2$ of said piezoelectric layer 12 is limited to a special value $d_{2i}$ in view of a large electromechanical coupling, the substrate 1 in FIG. 1 has only a temperature coefficient $(TC)_i$ shown in FIG. 2, while the substrate 3 exhibits the temperature coefficient (TC) ranging from $(TC)_{23}$ to $(TC)_{24}$ shown in FIG. 4. Referring to FIG. 5, the dependence of said (TC) on said $d_3$ is shown by curve 51. Said (TC) decreases from $(TC)_{24}$ to $(TC)_{23}$ as said $d_3$ increases up to a value larger than said λ. The substrate 3 with arbitrary temperature coefficient such as $(TC)_i$ between $(TC)_{23}$ and $(TC)_{24}$ can be obtained by choosing $d_{3i}$ as the intermediate layer thickness $d_3$.

From above description, it is evident that the multi-layered substrate 3 comprising the piezoelectric layer 12, the intermediate layer 33 and the base 14 for other order of magnitude than the above-described order of magnitude $(TC)_4 > (TC)_2 > (TC)_3$ can also be used for making a SAW device with a large electromechanical coupling and a controllable temperature coefficient.

It has also been discovered in accordance with this invention that the properties of the multi-layered substrate 3 can further be improved when a sign of said temperature coefficient in said intermediate layer $(TC)_3$ is different from that in said piezoelectric layer $(TC)_2$ or that in said base $(TC)_4$. Such a substrate 3 can easily be a substrate with very small or zero temperature coefficient and a large electromechanical coupling.

It has also been discovered in accordance with this invention that in such a multi-layered substrate 3, zinc oxide and silicon oxide can advantageously be used for said piezoelectric layer 12 and intermediate layer 33, respectively. The zinc oxide has a negative temperature coefficient of about −40 ppm/° C, while the silicon oxide has a positive temperature coefficient of about 80 ppm/° C. It is evident from the above description that the substrate having a temperature coefficient from about −40 to about 80 ppm/° C can be easily obtained. The zinc oxide layer has either polycrystalline or single crystalline form as long as the c-axis of the zinc oxide is approximately normal to the base plane. It is preferable that the angular spread of the c-axis about the normal direction is less than 10°, because a large electromechanical coupling cannot be obtained for the SAW device when the angular spread exceeds 10°. These zinc oxide and silicon oxide layers can be easily manufactured by conventional techniques such as a sputtering deposition method, chemical vapor deposition method and thermal oxidation process.

It has also been discovered in accordance with this invention that in the multi-layered substrate 3, the zinc oxide layer with a layer thickness $d_2$ ranging from 0.90/k to 4.6/k and the silicon oxide layer with a layer thickness $d_3$ greater than 3.0/k are proper for the SAW device, where $k$ is a wave constant and equal to $2\pi/\lambda$, as will be described hereinafter.

Figure 6:
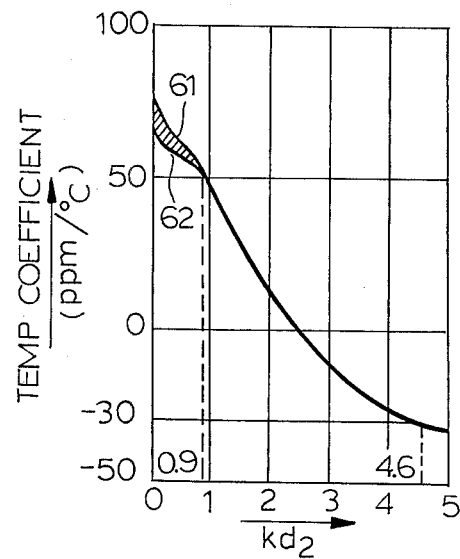

Referring to FIG. 6, the temperature coefficients of the substrate, in which said $d_3$ is much larger than 3.0/k and equal to 3.0/k, are shown by curve 61 and curve 62, respectively, when the base 14 is made of silicon. Said silicon is only considered to express the effect of the base material. The temperature coefficient of said substrate with said $d_3$ larger than 3.0/k is included in a hatched region shown in FIG. 6. The substrate having said $d_2$ less than 4.6/k is proper, because a range of a controllable temperature coefficient is very narrow when said $d_3$ is greater than 4.6/k. The substrate whith the temperature coefficient from about −30 to about 50 ppm/° C can be obtained irrespectively of the material forming the base 14, when said $d_3$ ranges from 0.9/k to 4.6/k.

Figure 7:
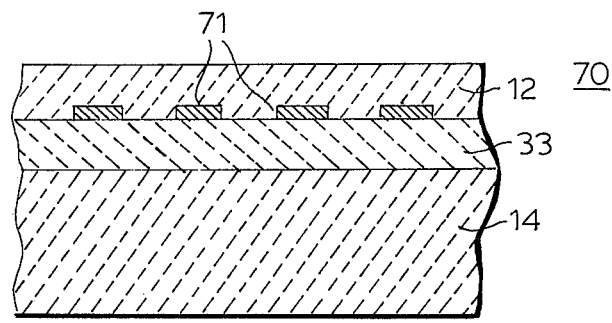
Figure 8:
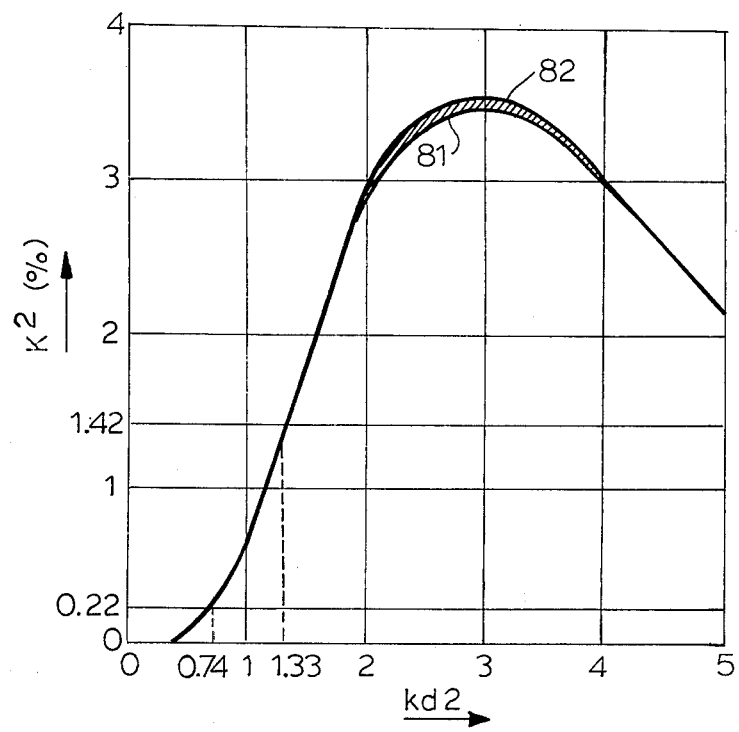

It has also been discovered in accordance with this invention that the substrate 3 comprising said zinc oxide piezoelectric layer and said silicon oxide intermediate layer has an electromechanical coupling larger than quartz and a controllable temperature coefficient by using an interdigital electrode. Referring to FIG. 7, the substrate 70 has an additional interdigital electrode 71 which is inserted between the zinc oxide layer 12 and the silicon oxide layer 33. Since the thickness of said interdigital electrode 71 is very small as compared with said $\lambda$, the temperature coefficient of said substrate 70 is essentially shown by curve 61. Referring to FIG. 8, square of an electromechanical coupling $K^2$ of the substrate 70 is shown by curve 81 and curve 82 corresponding to said $d_3$ much larger than 3.0/k and equal to 3.0/k, respectively, when the base 14 is made of silicon. The hatched region shown in FIG. 8 expresses the effect of the base material. The substrate 70 has said $K^2$ larger than 0.22% (a maximum value of quartz), when said $d_2$ is larger than 0.74/k. It is evident from the above description that the substrate 70, which has a temperature coefficient ranging from about −30 to about 50 ppm/° C and an electromechanical coupling larger than a quartz value, can be obtained, when said $d_2$ ranges from 0.9/k to 4.6/k.

It has also been discovered in accordance with this invention that said substrate 70 is more proper, when said $d_2$ is greater than 1.33/k. When an interdigital electrode is placed on said zinc oxide having a sufficiently large thickness, said $K^2$ is 1.42 %. Referring again to FIGS. 6 and 8, the substrate 70, which has a temperature coefficient from about −30 to about 35 ppm/° C and an electromechanical coupling larger than that of said zinc oxide with a sufficiently large thickness, can be obtained, when said $d_2$ ranges from 1.33/k to 4.6/k.

Figure 9:
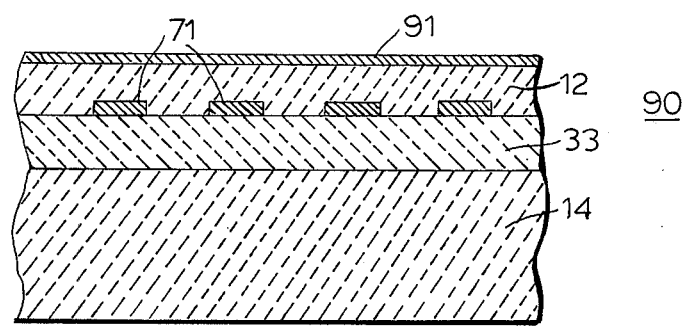
Figure 10:
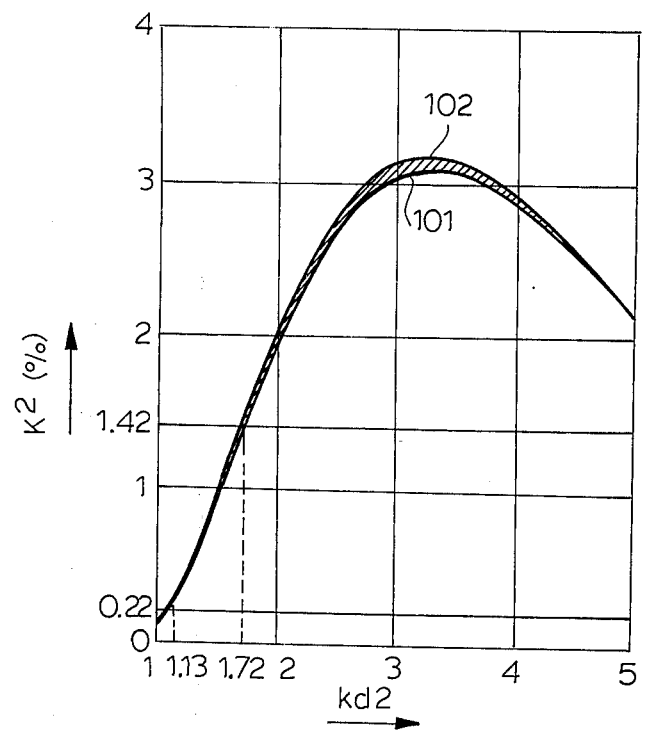

It has also been discovered in accordance with this invention that the substrate with an additional metal film can also be used for a SAW device. Referring to FIG. 9, the substrate 90 additionally has a metal film 91 on the top of said zinc oxide layer 12. The temperature coefficient of said substrate 90 is essentially shown by curve 61, because the thickness of said metal film 91 is very small as compared with said $\lambda$. Referring to FIG. 10, square of an electromechanical coupling $K^2$ of the substrate 90 is shown by curves 101 and 102. The curves 101 and 102 in FIG. 10 have the same meaning as curves 81 and 82 in FIG. 8. Referring to FIGS. 6 and 10, the substrate 90, in which a temperature coefficient is about −30 to about 40 ppm/° C and an electromechanical coupling is larger than a quartz value, can be obtained, when said $d_2$ ranges from 1.13/k to 4.6/k.

It has also been discovered in accordance with this invention that said substrate 90 is more proper, when said $d_2$ is greater than 1.72/k. Referring again to FIGS. 6 and 10, the substrate 90, which has a temperature coefficient from about −30 to about 20 ppm/° C and an electromechanical coupling larger than a value of said zinc oxide with a sufficiently large thickness, can be obtained, when said $d_2$ ranges from 1.72/k to 4.6/k.

Figure 11:
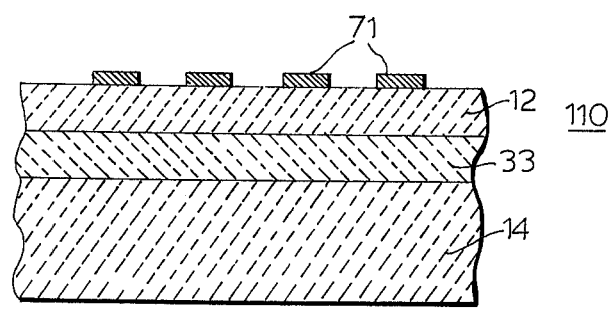
Figure 12:
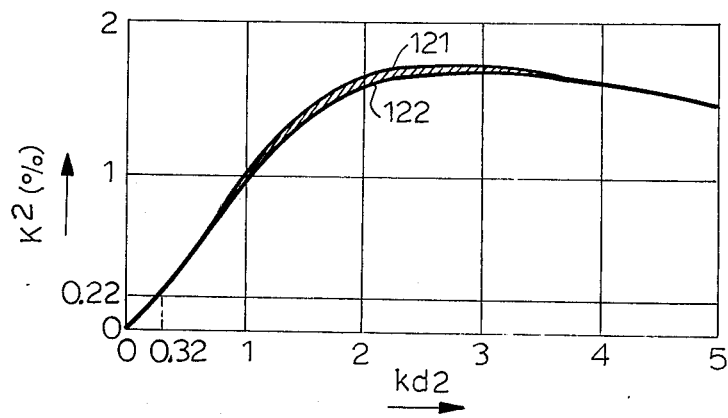

It has also been discovered in accordance with this invention that the substrate 3 comprising said zinc oxide piezoelectric layer and said silicon oxide intermediate layer has an electromechanical coupling larger than a quartz value and a controllable temperature coefficient by using an interdigital electrode. Referring to FIG. 11, the substrate 110 has an additional interdigital electrode 71 on the top of said zinc oxide layer 12. The temperature coefficient of said substrate 110 is essentially shown by curve 61, because the thickness of said interdigital electrode 71 is much smaller than said $\lambda$. Referring to FIG. 12, square of an electromechanical coupling $K^2$ of the substrate 110 is shown by curves 121 and 122. The curves 121 and 122 in FIG. 12 have also the same meaning as curves 81 and 82 in FIG. 8. Referring to FIGS. 6 and 12, the substrate 110, in which a temperature coefficient is about −30 to about 50 ppm/° C and an electromechanical coupling is larger than a value of quartz, can be obtained, when said $d_2$ ranges from 0.90/k to 4.6/k.

Figure 13:
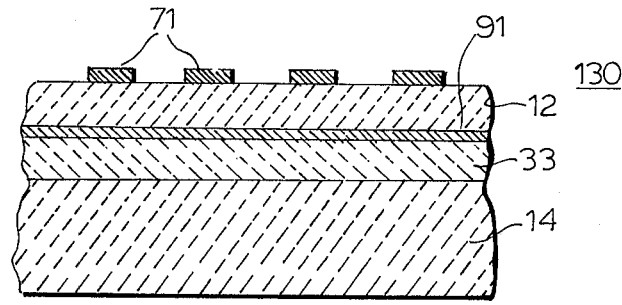
Figure 14:
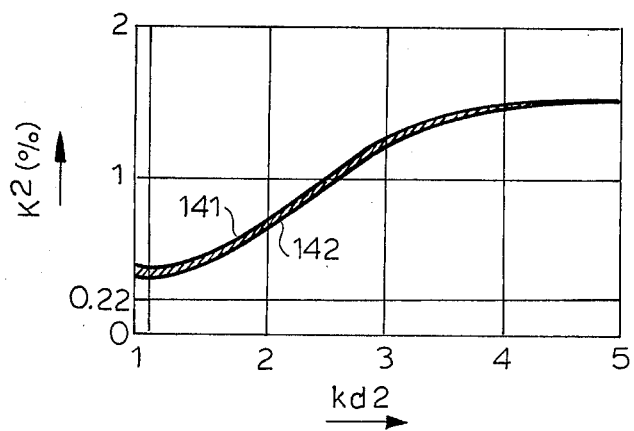

It has also been discovered in accordance with this invention that the substrate with an additional metal film can also be utilized for a SAW device. Referring to FIG. 13, the substrate 130 has an additional metal film 91 between said zinc oxide layer 12 and said silicon oxide layer 14. The temperature coefficient of said substrate 130 is essentially shown by curve 61, because the thickness of said metal film and said interdigital electrode is much smaller than said $\lambda$. Referring to FIG. 14, square of an electromechanical coupling $K^2$ of the substrate 130 is shown by curves 141 and 142. The curves 141 and 142 in FIG. 14 have also the same meaning as curves 81 and 82 in FIG. 8. Referring to FIGS. 6 and 14, the substrate 130, in which the temperature coefficient is about −30 to about 50 ppm/° C and an electromechanical coupling is larger than the value of quartz, can be obtained, when said $d_2$ ranges from $0.90/k$ to $4.6/k$.

It has also been discovered in accordance with this invention that in the multi-layered substrate 3 comprising said zinc oxide piezoelectric layer and said silicon oxide intermediate layer, silicon can advantageously be used for said base 14. As said silicon has a negative temperature coefficient, about $-20$ ppm/° C which is between the TC of said zinc oxide (about $-40$ ppm/° C) and the TC of said silicon oxide (about 80 ppm/° C), said substrate having the temperature coefficient from $-40$ to 80 ppm/° C can be easily obtained. Said silicon has either polycrystalline or single crystalline form.

It has also been discovered in accordance with this invention that the multi-layered substrate 3 comprising said zinc oxide piezoelectric layer, said silicon oxide intermediate layer and said silicon base, in which a layer thickness $d_2$ of said zinc oxide layer is less than $4.6/k$ (not including zero) and a layer thickness $d_3$ of said silicon oxide layer is less than $3.0/k$ (not including zero), is proper for the SAW device, as described hereinafter.

Figure 15:
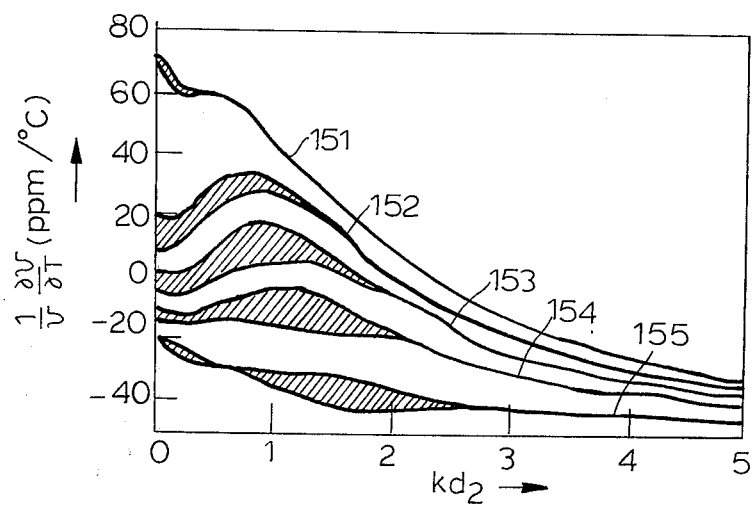

Referring to FIG. 15, the temperature coefficient of said substrate is shown by curves 151, 152, 153, 154 and 155 for said $d_3$ equal to $3.0/k$, $1.0/k$, $0.6/k$, $0.3/k$ and much smaller than $0.01/k$, respectively. When said silicon base has a (011) crystallographic plane and the SAW propagates in a direction of a [100] axis of said silicon crystal, the propagation is named as the (011) [100] propagation. The upper and lower limits in these curves correspond to the case of the (011) [100] propagation and the (111) [1$\bar{1}$0] propagation, respectively. The temperature coefficients for the cases of other planes and other axis propagations are included in the hatched region shown in FIG. 15. The temperature coefficient for the case of polycrystal silicon base is also included in said hatched region.

Figure 16:
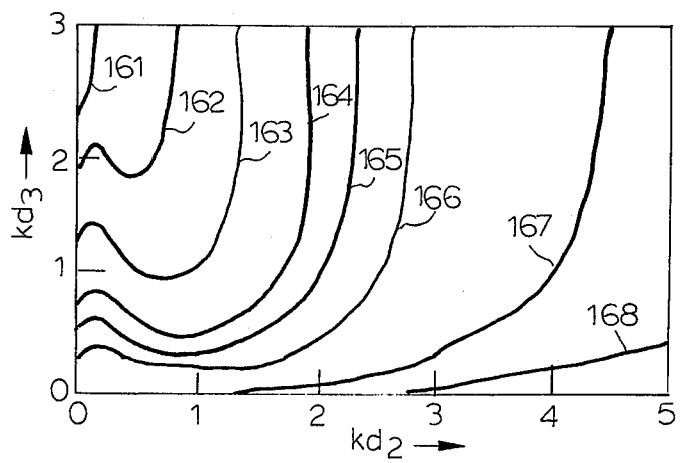
Figure 17:
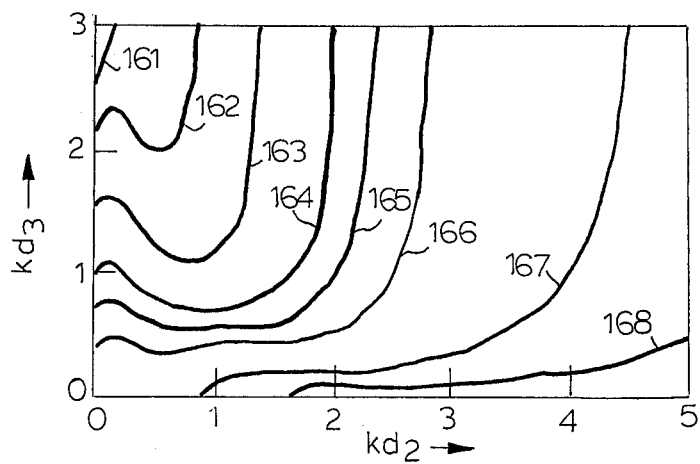
Figure 18:
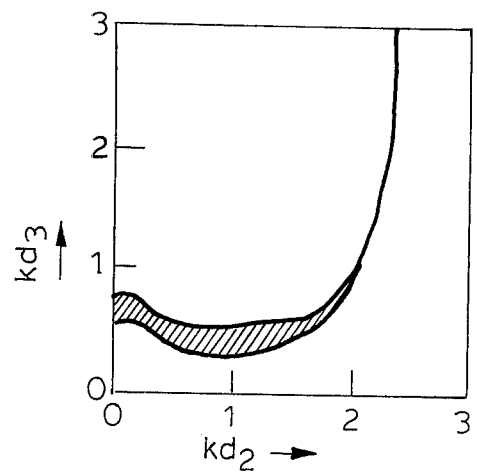

Referring to FIGS. 16 and 17, regions of said $d_2$ and said $d_3$ for fixed temperature coefficients such as 60, 50, 30, 10, 0, $-10$, $-30$ and $-40$ ppm/° C are shown by curves 161, 162, 163, 164, 165, 166, 167 and 168, respectively. Thus curves in FIG. 16 and FIG. 17 correspond to the cases of the (011) [100] propagation and the (111) [1$\bar{1}$0] propagation, respectively. In the case of other propagation planes and axes and in the case of polycrystalline silicon base, each region to be surrounded by the curves of the same number in FIGS. 16 and 17 shows values of said $d_2$ and $d_3$ for any fixed temperature coefficient. For example, the substrate having zero temperature coefficient can be obtained by choosing said $d_2$ and $d_3$ in the hatched region in FIG. 18, irrespectively of crystallographic properties of the silicon base.

Referring to FIGS. 15, 16, 17 and 18, when said $d_3$ is greater than $3.0/k$, there is little merit obtained by using the multi-layer which comprises said zinc oxide piezoelectric layer, said silicon oxide intermediate layer and said silicon base, because the temperature coefficient is determined only by said zinc oxide layer and said silicon oxide layer. When said $d_2$ is greater than $4.6/k$, there is also little merit, because the temperature coefficient of the substrate is determined almost only by said zinc oxide layer. The substrate, which has a temperature coefficient ranging from about $-40$ to about 60 ppm/° C, can be obtained irrespectively of crystallographic properties of said silicon base, when said $d_2$ and $d_3$ are less than $4.6/k$ and $3.0/k$, respectively.

Figure 19:
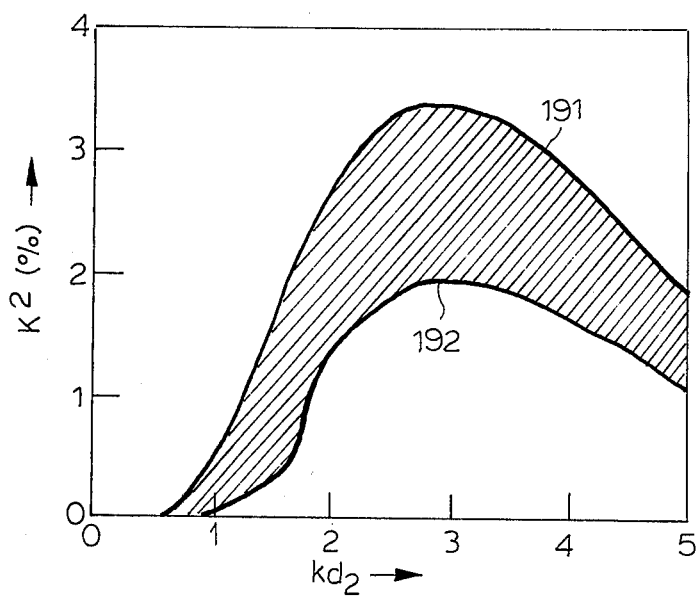

It has also been discovered in accordance with this invention that the multi-layered substrate 70 comprising said zinc oxide piezoelectric layer, said silicon oxide intermediate layer and said silicon base has an electromechanical coupling larger than a quartz value and a more controllable temperature coefficient, when said $d_2$ and $d_3$ are larger than $0.72/k$ and $0.02/k$, respectively. Referring to FIG. 19, square of an electromechanical coupling $K^2$ is shown by curves 191 and 192, when said $d_3$ is equal to $0.2/k$. The curve 191 corresponds to the case of the (011) [100] propagation, when an electrical resistivity $\rho$ of said silicon base is sufficiently high. The curve 192 for said $d_2$ greater than $1.76/k$ corresponds to the case of the (111) [1$\bar{1}$0] propagation and zero $\rho$, while the curve 192 for said $d_2$ less than $1.76/k$ corresponds to the case of (001) [$ij$0] and zero $\rho$, where the [$ij$0] axis has an angle of about 30° to 44° from the [100] axis. Said $K^2$ for the cases of other propagation planes, other propagation axes, polycrystalline silicon bases and finite values of said $\rho$ are included in the hatched region shown in FIG. 19. Similar curves are obtained for other values of said $d_3$.

Figure 20:
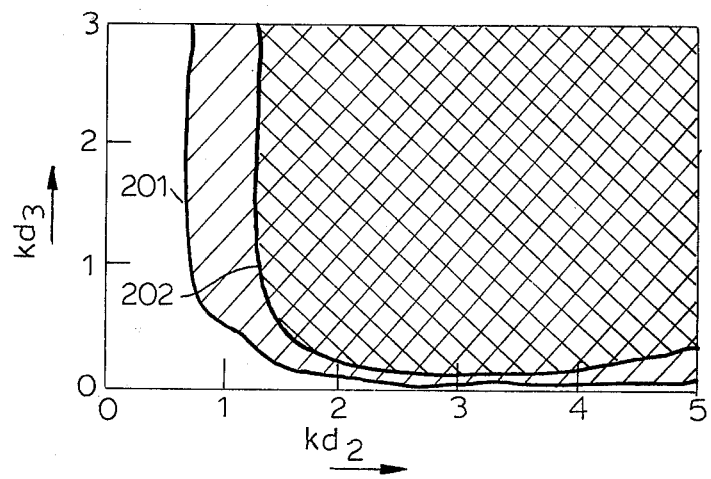

Referring to FIG. 20, curves 201 and 202 show the most limited regions of said $d_2$ and $d_3$ for which said $K^2$ of said substrate 70 are 0.22% (a maximum value of quartz) and 1.42% (a value of said zinc oxide), respectively. Said substrate 70 has said $K^2$ larger than a quartz value when said $d_2$ and $d_3$ are included in the hatched and crosshatched regions shown in FIG. 20. The temperature coefficient of said substrate 70 is essentially shown in FIGS. 15, 16, 17 and 18, because the interdigital electrode has a thickness much smaller than said $\lambda$. It is evident from FIGS. 15, 16, 17 and 20 that said substrate 70, which has a temperature coefficient from about $-40$ to about 50 ppm/° C and an electromechanical coupling larger than a quartz value, can be obtained irrespectively of crystallographical and electrical properties of said silicon base, when said $d_2$ ranges from $0.72/k$ to $4.6/k$ and said $d_3$ ranges from $0.02/k$ to $3.0/k$.

It has also been discovered in accordance with this invention that said substrate 70 comprising said zinc oxide piezoelectric layer, said silicon oxide intermediate layer and said silicon base is more proper, when said $d_2$ and $d_3$ are larger than $1.32/k$ and $0.13/k$, respectively. Referring again to FIG. 20, said substrate 70 has said $K^2$ larger than said zinc oxide value when said $d_2$ and $d_3$ are included in the crosshatched region. Referring to FIGS. 15, 16 and 17, said substrate 70, which has a temperature coefficient from about $-40$ to about 30 ppm/° C and an electromechanical coupling larger than the value of said zinc oxide having a sufficiently large thickness, can be obtained irrespectively of crystallographical and electrical properties of said silicon base, when said $d_2$ ranges from $1.32/k$ to $4.6/k$ and said $d_3$ ranges from $0.13/k$ to $3.0/k$.

Figure 21:
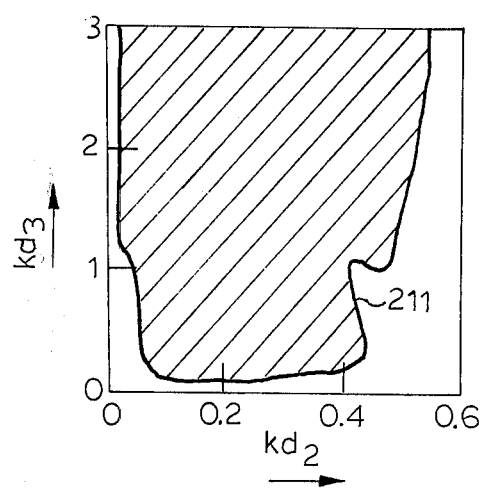

It has also been discovered in accordance with this invention that the substrate 90 comprising said zinc oxide piezoelectric layer, said silicon oxide intermediate layer and said silicon base has an electromechanical coupling larger than a quartz value and a more controllable temperature coefficient, when said $d_2$ ranges from $0.02/k$ to $0.55/k$ and said $d_3$ ranges from $0.07/k$ to $3.0/k$. The curve 211 in FIG. 21 shows the most limited region of said $d_2$ and $d_3$ for which $K^2$ of said substrate 90 is 0.22%, just as in the case of the curve 201 in FIG. 20. Said substrate 90 has said $K^2$ larger than the value of quartz, when said $d_2$ and $d_3$ are included in the hatched region shown in FIG. 21. The temperature coefficients of said substrate 90 are essentially shown in FIGS. 15, 16, 17 and 18, because both the interdigital electrode and the metal film have thicknesses much smaller than said λ. Referring to FIGS. 15, 16, 17 and 21, said substrate 90, which has a temperature coefficient from about −20 to about 60 ppm/° C and an electromechanical coupling larger than a quartz value, can be obtained irrespectively of crystallographic and electrical properties of said silicon base, when said $d_2$ ranges from $0.02/k$ to $0.55/k$ and said $d_3$ ranges from $0.07/k$ to $3.0/k$.

Figure 22:
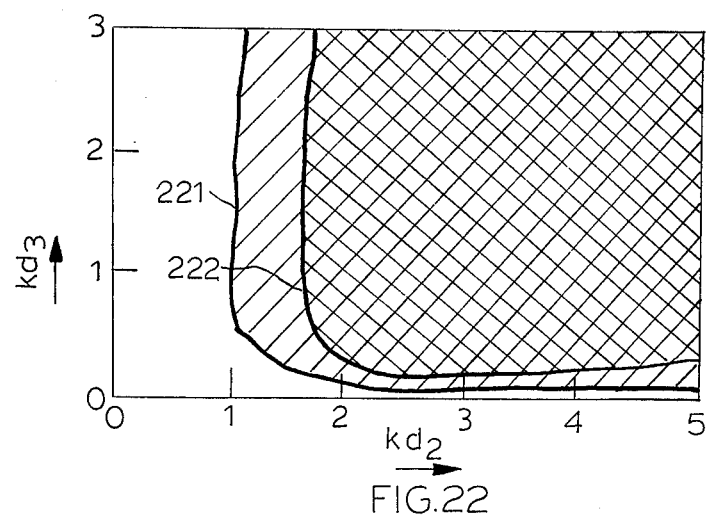

It has also been discovered in accordance with this invention that the substrate 90 comprising said zinc oxide piezoelectric layer, said silicon oxide intermediate layer and said silicon base has an electromechanical coupling larger than a quartz value and a more controllable temperature coefficient, when said $d_2$ and $d_3$ are larger than $1.04/k$ and $0.02/k$, respectively. Just as in the case of the curves 201 and 202 in FIG. 20, the curves 221 and 222 in FIG. 22 show the most limited regions of said $d_2$ and $d_3$, for which said $K^2$ of said substrate 90 are 0.22% and 1.42%, respectively. When said $d_2$ and $d_3$ are included in the hatched and crosshatched regions shown in FIG. 22, said substrate has said $K^2$ larger than a quartz value. The temperature coefficient of said substrate 90 is essentially shown in FIGS. 15, 16, 17 and 18, because both the interdigital electrode and the metal film have thicknesses much smaller than said λ. Referring again to FIGS. 15, 16, 17 and 22, said substrate 90, which has a temperature coefficient from about −40 to about 40 ppm/° C and an electromechanical coupling larger than a quartz value, can be obtained irrespectively of crystallographical and electrical properties of said silicon base, when said $d_2$ ranges from $1.04/k$ to $4.6/k$ and said $d_3$ ranges from $0.02/k$ to $3.0/k$.

It has also been discovered in accordance with this invention that said substrate 90 comprising said zinc oxide piezoelectric layer, said silicon oxide intermediate layer and said silicon base is more proper, when said $d_2$ and $d_3$ are larger than $1.62/k$ and $0.14/k$, respectively. Referring to FIG. 22, said substrate 90 has said $K^2$ larger than said zinc oxide value, when said $d_2$ and $d_3$ are included in the crosshatched region shown in FIG. 22. Said substrate 90, which has a temperature coefficient from about −40 to about 20 ppm/° C and an electromechanical coupling larger than said zinc oxide value, can be obtained irrespectively of crystallographical and electrical properties of said silicon base, when said $d_2$ ranges from $1.62/k$ to $4.6/k$ and said $d_3$ ranges from $0.14/k$ to $3.0/k$, as apparent from FIGS. 15, 16, 17 and 22.

Figure 23:
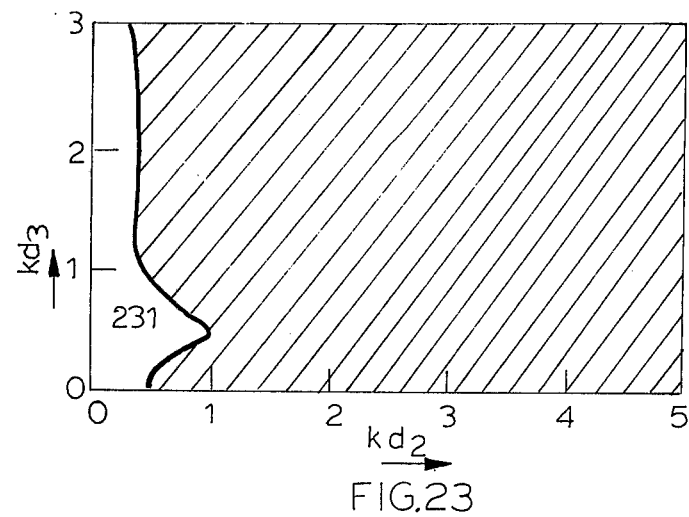

It has also been discovered in accordance with this invention that the substrate 110 comprising said zinc oxide piezoelectric layer, said silicon oxide intermediate layer and said silicon base has an electromechanical coupling larger than a quartz value and a more controllable temperature coefficient, when said $d_2$ is larger than $0.32/k$. Just as in the case of the curve 201 in FIG. 20, the curve 231 in FIG. 23 shows the most limited region of said $d_2$ and $d_3$, for which said $K^2$ of said substrate 110 is 0.22%. Said substrate 110 with said $d_2$ and $d_3$ included in the hatched region shown in FIG. 23 has said $K^2$ larger than a quartz value. The temperature coefficient of said substrate is essentially shown in FIGS. 15, 16, 17 and 18, because the interdigital electrode has a thickness much smaller than said λ. Referring to FIGS. 15, 16, 17 and 23, said substrate 110, which has a temperature coefficient from about −40 to about 55 ppm/° C and an electromechanical coupling larger than a quartz value, can be obtained irrespectively of crystallographic and electrical properties of said silicon base, when said $d_2$ ranges from $0.32/k$ to $4.6/k$ and said $d_3$ is less than $3.0/k$.

Figure 24:
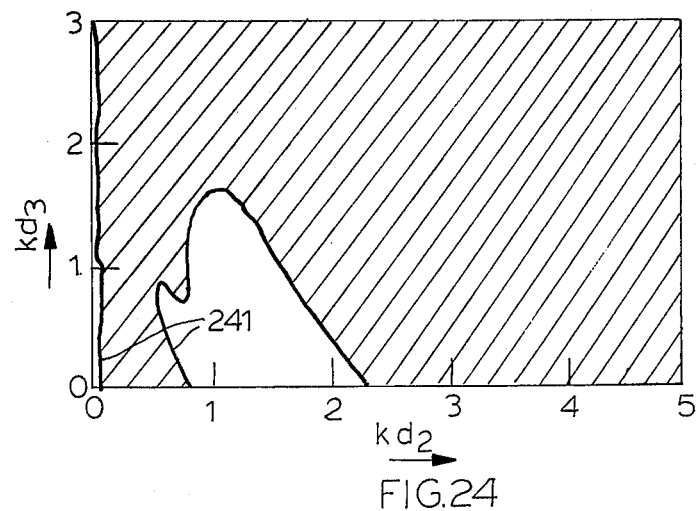

It has also been discovered in accordance with this invention that the substrate 130 comprising said zinc oxide piezoelectric layer, said silicon oxide intermediate layer and said silicon base has an electromechanical coupling larger than a quartz value and a more controllable temperature coefficient, when said $d_2$ is larger than $0.02/k$. Just as in the case of the curve 201 in FIG. 20, the curve 241 in FIG. 24 shows the most limited region of said $d_2$ and $d_3$, for which said $K^2$ of said substrate 130 is 0.22%. Said substrate 130 with said $d_2$ and $d_3$ included in the hatched region shown in FIG. 24 has said $K^2$ larger than a quartz value. The temperature coefficient of said substrate is essentially shown in FIGS. 15, 16, 17 and 18, because both the interdigital electrode and the metal film have thicknesses much smaller than said λ. Referring to FIGS. 15, 16, 17 and 24, said substrate 130, which has a temperature coefficient from about −40 to about 60 ppm/° C and an electromechanical coupling larger than a quartz value, can be obtained irrespectively of crystallographic and electrical properties of said silicon base, when said $d_2$ ranges from $0.02/k$ to $4.6/k$ and said $d_3$ is less than $3.0/k$.

It is thought that this invention can be understood from the foregoing descriptions. It is apparent that various changes and modifications can be made in the materials of the base, the piezoelectric layer and the intermediate layer and the construction of the interdigital electrodes for generating and detecting a SAW without departing from the spirit and scope of this invention.

What is claimed is:

1. A multi-layered substrate for a surface-acoustic-wave device, comprising, in the following order, a base, an intermediate layer and a piezoelectric layer, the temperature coefficient of a surface-acoustic-wave phase velocity in said piezoelectric layer being different from that in said base, said piezoelectric layer having a layer thickness less than the wave length of said surface-acoustic-wave, the sign of the temperature coefficient of said intermediate layer being different from that of said piezoelectric layer or said base, said piezoelectric layer and said intermediate layer being made of zinc oxide and silicon oxide, respectively.

2. A multi-layered substrate as claimed in claim 1, in which the layer thickness of said zinc oxide layer ranges from $0.90/k$ to $4.6/k$ and the layer thickness of said silicon oxide layer is greater than $3.0/k$, where $k$ is a wave constant which is equal to $2\pi/\lambda$, λ being the wavelength of said surface-acoustic-wave.

3. A multi-layered substrate as claimed in claim 2, in which an interdigital electrode is additionally inserted between said zinc oxide layer and said silicon oxide layer.

4. A multi-layered substrate as claimed in claim 3, in which said zinc oxide layer has a thickness larger than $1.33/k$.

5. A multi-layered substrate as claimed in claim 3, in which a metal film is additionally provided on a top of said zinc oxide, the layer thickness of said zinc oxide layer being greater than $1.13/k$ and the thickness of said metal film being very much smaller than said wave length.

6. A multi-layered substrate as claimed in claim 5, in which said zinc oxide layer has a thickness larger than $1.72/k$.

7. A multi-layered substrate as claimed in claim 2, in which an interdigital electrode is additionally provided on a top of said zinc oxide layer.

8. A multi-layered substrate as claimed in claim 7, in which a metal film is additionally inserted between said zinc oxide layer and said silicon oxide layer, said metal film having a thickness very much smaller than said wave length.

9. A multi-layered substrate as claimed in claim 1, in which said base is made of silicon.

10. A multi-layered substrate as claimed in claim 9, in which the layer thickness of said zinc oxide layer is less than $4.6/k$ and the layer thickness of said silicon oxide layer is less than $3.0/k$, where $k$ is a wave constant which is equal to $2\pi/\lambda$, $\lambda$ being the wave length of said surface-acoustic-wave.

11. A multi-layered substrate as claimed in claim 10, in which an interdigital electrode is additionally inserted between said zinc oxide layer and said silicon oxide layer, the layer thickness of said zinc oxide layer being larger than $0.72/k$ and the layer thickness of said silicon oxide layer being larger than $0.02/k$.

12. A multi-layered substrate as claimed in claim 11, in which said zinc oxide layer has a layer thickness larger than $1.32/k$, and said silicon oxide layer has a layer thickness larger than $0.13/k$.

13. A multi-layered substrate as claimed in claim 10, in which an interdigital electrode is additionally inserted between said zinc oxide layer and said silicon oxide layer, and a metal film is added on a top of said zinc oxide layer, the thickness of said zinc oxide layer ranging from $0.02/k$ to $0.55/k$, and the thickness of said silicon oxide layer being larger than $0.07/k$.

14. A multi-layered substrate as claimed in claim 10, in which an interdigital electrode is additionally inserted between said zinc oxide layer and said silicon oxide layer, and a metal film is added on a top of said zinc oxide layer, the thickness of said zinc oxide layer being larger than $1.04/k$, and the thickness of said silicon oxide layer being larger than $0.02/k$.

15. A multi-layered substrate as claimed in claim 14, in which said zinc oxide layer has a thickness larger than $1.62/k$, and said silicon oxide layer has a thickness larger than $0.14/k$.

16. A multi-layered substrate as claimed in claim 10, in which an interdigital electrode is added on a top of said zinc oxide layer, said zinc oxide layer having a layer thickness larger than $0.32/k$.

17. A multi-layered substrate as claimed in claim 10, in which an interdigital electrode is added on a top of said zinc oxide layer, and a metal film is additionally inserted between said zinc oxide layer and said silicon oxide layer, said zinc oxide layer having a thickness larger than $0.02/k$.

* * * * *